June 20, 1967 L. S. GREENBERG ETAL 3,327,183

CONTROLLED RECTIFIER HAVING ASYMMETRIC CONDUCTIVITY GRADIENTS

Original Filed Oct. 28, 1963 3 Sheets-Sheet 1

INVENTORS
LEON S. GREENBERG,
JOHN NEILSON &
HARRY WEISBERG

BY W. S. Hill
AGENT

CONTROLLED RECTIFIER HAVING ASYMMETRIC CONDUCTIVITY GRADIENTS

Original Filed Oct. 28, 1963 3 Sheets--Sheet 2

INVENTORS
LEON S. GREENBERG
JOHN NEILSON &
HARRY WEISBERG

BY
AGENT

INVENTORS
LEON S. GREENBERG
JOHN NEILSON &
HARRY WEISBERG
BY W. B. Hill
AGENT

United States Patent Office 3,327,183

Patented June 20, 1967

3,327,183

CONTROLLED RECTIFIER HAVING ASYMMETRIC CONDUCTIVITY GRADIENTS

Leon S. Greenberg, Kingston, John Neilson, Mountaintop, and Harry Weisberg, Forty Fort, Pa., assignors to Radio Corporation of America, a corporation of Delaware Continuation of application Ser. No. 319,433, Oct. 28, 1963. This application Aug. 12, 1966, Ser. No. 572,151

4 Claims. (Cl. 317—235)

ABSTRACT OF THE DISCLOSURE

A PNPN device such as a controlled rectifier in which the charge carrier concentration on the surface of the anode region is more than 100 times the charge carrier concentration on the surface of the gate region, and the conductivity gradient of the anode region is at least an order of magnitude steeper than the conductivity gradient of the gate region.

*Cross-reference to related application*

This application is a continuation of application Ser. No. 319,433, filed Oct. 28, 1963, now abandoned.

*Background of the invention*

(1) *Field of the invention.*—This invention relates to improved semiconductor devices.

(2) *Description of the prior art.*—One class of semiconductor devices comprises a wafer or die of crystalline semiconductive material having four zones or regions of alternate conductivity types, and three rectifying barriers or p-n junctions between the four zones. For example, a device of this class may consist of a semiconductive wafer having two opposing major faces, a P-type region or zone known as the anode region adjacent one major wafer face, an N-type region known as the base region adjacent the anode, a P-type region known as the gate adjacent the base region, an N-type region known as the cathode region which extends from the gate region to the other major wafer face, and electrical connections to the anode, gate, and cathode regions. Devices of this type are known as controlled rectifiers, and are generally prepared from monocrystalline silicon wafers. They are also known as PNPN or as NPNP switches.

Controlled rectifiers have hitherto been fabricated by a series of diffusion steps so that the anode and gate regions are formed simultaneously adjacent opposing faces of a semiconductor wafer. Since these anode and gate regions or zones have been formed by diffusion of a conductivity modifier (a donor or an acceptor) into the wafer, the concentratiton of the conductivity modifier or doping agent, and hence the conductivity of the region, is graded from high adjacent the wafer face to low with increasing depth into the wafer, that is, the conductivity of the anode and gate regions increases with increasing distance from the base. In the prior art devices thus fabricated, the anode and gate regions are symmetrical, that is, they have about the same thickness, about the same concentration of conductivity modifiers at the surface, and have about the same conductivity gradient. While satisfactory controlled rectifiers have been fabricated in this manner, improvement is desirable in respect to: ability to withstand current surges, ability to withstand high applied voltages, faster turnoff time, and more constant current gain when the anode-cathode current is increased.

Accordingly, it is an object of this invention to provide improved semiconductor devices.

Another object is to provide improved controlled rectifiers having improved ability to withstand current surges.

Still another object is to provide improved controlled rectifiers having improved ability to withstand high applied voltages.

But another object is to provide improved controlled rectifiers having faster turnoff time.

Yet another object is to provide improved methods of fabricating improved controlled rectifiers.

*Summary of the invention*

A semiconductor device is provided comprising a crystalline semiconductive wafer having two opposing major faces, a cathode region, a gate region, a base region, and an anode region in said wafer, the charge carrier concentration of the anode region and the gate region increasing with increasing distance from the base region, and the conductivity gradient of the anode region being steeper than the conductivity gradient of the gate region.

*Description of the preferred embodiments*

EXAMPLE I

Figure 1A:
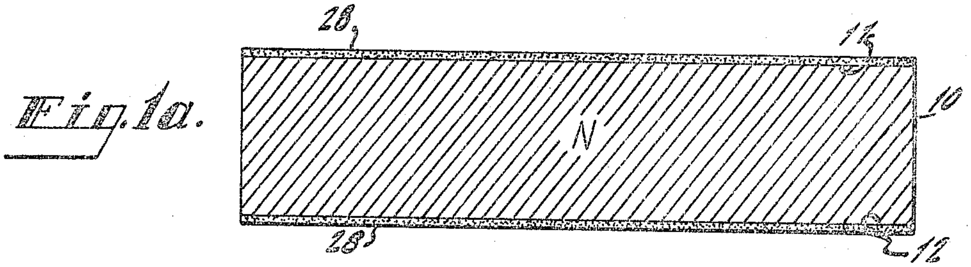
FIGURES 1*a*–1*f* are cross-sectional views of a semiconductive wafer during successive steps in the fabrication of a semiconductor device according to one embodiment of the invention.

A slice or wafer 10 (FIGURE 1*a*) of crystalline semiconductive material is prepared with two opposing major faces 11 and 12. The slice 10 may be of either conductivity type. In this example, slice 10 consists of N-type conductivity, monocrystalline silicon, and has a resistivity of about 20–40 ohm-cm. The exact size and shape of slice 10 is not critical in the practice of the invention. Suitably, slice 10 is about 1" in diameter and about 8 to 10 mils thick.

Figure 1B:
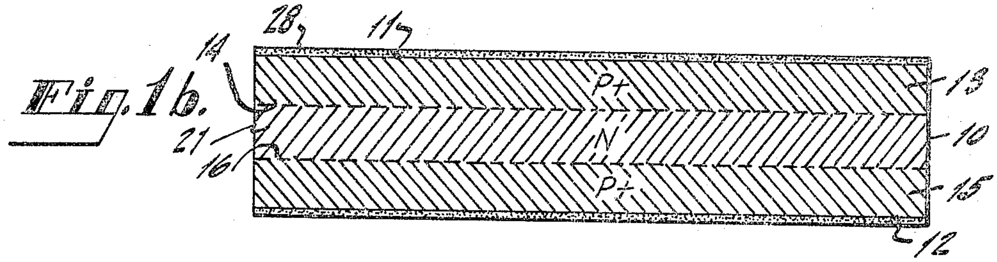

Both major faces 11 and 12 of wafer 10 are painted with a solution of a boron compound, such as boric acid or the like, in a volatile solvent such as Cellosolve (ethylene glycol monomethyl ether) or the like. The solvent evaporates, depositing a thin film 28 of the boron compound on both major wafer faces. Wafer 10 is then heated, for example, in a furnace tube (not shown), for about 10 hours at about 1300° C. During this step, sufficient boron diffuses into both major wafer faces 11 and 12 to convert the adjacent wafer regions 13 and 15 (FIGURE 1*b*) respectively to P+ conductivity. The concentration of boron on wafer faces 11 and 12 is about $10^{21}$ atoms boron per $cm.^3$ after this first diffusion step. The boron concentration in regions 13 and 15 is graded, and decreases with increasing depth into the wafer. The conductivity of regions 13 and 15 is similarly graded, and decreases with increasing depth into the wafer. In this example, the P+ type regions 13 and 15 thus formed are about 2¼ mils thick. Rectifying barriers or p-n junctions 14 and 16 are formed between the boron-diffused regions 13 and 15 respectively and the N-type bulk 21 of wafer 10.

Figure 1C:
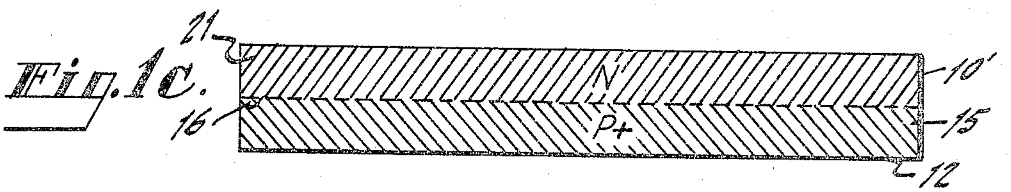

One of the boron-diffused wafer regions is now removed by any convenient method, such as grinding, or lapping, or masking and etching. In this example, wafer region 13 is removed, leaving the remaining portion 10' of the wafer 10 as shown in FIGURE 1*c*. The boron deposit 28 on the remaining wafer face 12 may be permitted to remain during the entire process, or, as in this example, may be removed.

Figure 1D:
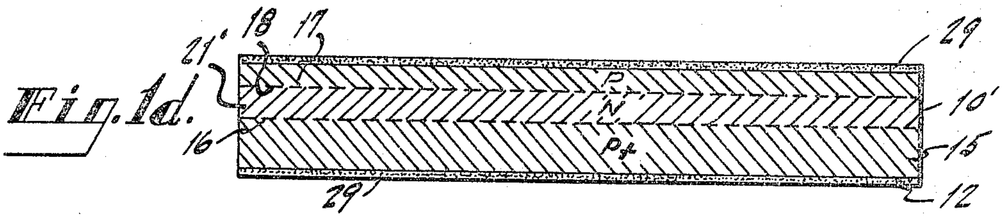

Wafer 10' is now heated in an oxygen-nitrogen ambient containing boron oxide vapors. This second step is performed at about 1300° C. for about 20 hours. However, during this second heating step the concentration of boron oxide in the ambient is maintained at a level below saturation. In this example, a suitable ambient concentration of $B_2O_3$ in the furnace tube is obtained by heating a container of $B_2O_3$ to 860° C. As a result of this second diffusion step, a P type region 17 (FIGURE 1*d*) about 1¾ to 2 mils thick is formed in the N-type portion 21 of wafer 10' opposite face 12. The concentration of boron on the surface of region 17 is about $2\times10^{18}$ atoms per cm.$^3$. A p-n junction 18 is formed at the interface between the P-type region 17 and the remainder 21' of the original N-type portion 21 of the wafer. This heating step also increases the thickness of the P+ type layer 15 to about 3¼ mils. At the same time, the oxygen present in the ambient during the second diffusion step oxidizes the surface of wafer 10' so that a surface layer 29 of silicon oxide is formed on the major faces of the wafer 10'.

Figure 1E:
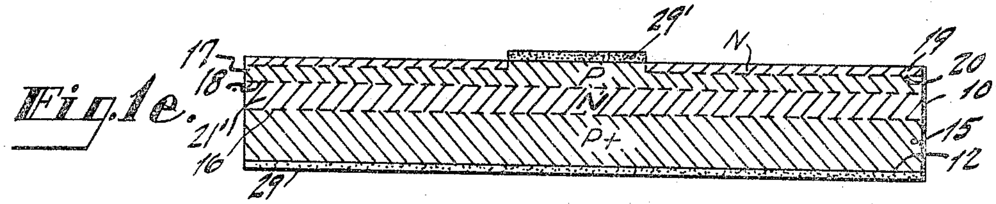

A predetermined portion of the silicon oxide layer 29 is removed from the face of wafer 10' opposite face 12. Removal of the silicon oxide is accomplished by lapping, or grinding, or by masking and etching. The remaining portion 29' (FIGURE 1*e*) of the silicon oxide layer serves as a diffusion mask in the next step, which consists of heating wafer 10' about 1½ hours at about 1225° C. in the vapors of phosphorus pentoxide. A thin phosphorus-diffused N-type region 19 is thus introduced in wafer 10' adjacent the exposed unmasked portions of the wafer. A rectifying barrier of p-n junction 20 is formed at the interface between the phosphorus diffused wafer region 19 and the boron-diffused region 17.

Figure 1F:
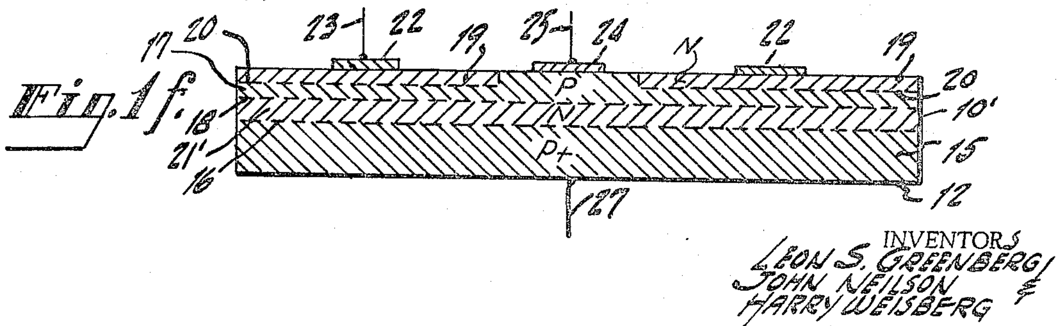

Referring now to FIGURE 1*f*, the silicon oxide coating is removed, for example by etching, and a ring-shaped metallic electrode 22 is deposited by any convenient method, for example by evaporation, on the face opposite wafer face 12 so as to form an ohmic contact to the N-type region 19. At the same time, an ohmic contact 24 is made to the P-type region 17. Contact 24 is suitably formed within the area bounded by the ring-shaped electrode 22. The device is completed by attaching electrical lead 23 and 25 to electrodes 22 and 24, respectively. An electrical lead 27 to wafer region 15 may be attached to wafer face 12. Alternatively, the electrical connection to region 15 may be made by bonding wafer face 12 to the bottom of a metallic can, and attaching the lead to the can. The subsequent steps of encapsulating and casing the device may be accomplished by standard techniques of the semiconductor art, and need not be described here.

In the completed device, the P+ type boron-diffused wafer region 15 is the anode region, and electrical contact is made thereto by lead 27 to the wafer face 12, or by bonding wafer face 12 to a metallic stud or can. The P-type boron-diffused region 17 is the gate region; contact 24 is the gate contact thereto; and lead 25 is the gate lead. The N-type phosphorus-diffused region 19 is the cathode region; contact 22 is the cathode contact; and lead 23 is the cathode lead.

The gate region 17 and the anode region 15 of the device are asymmetric. The anode region 15 has a high charge carrier concentration and a high conductivity at wafer face 12, since the boron concentration at the wafer surface of face 12 is about $10^{21}$ boron atoms per cm.$^3$.

The gate region 17 has a lower charge carrier concentration and conductivity at the wafer surface, since the boron concentration at the surface of gate region 17 is about $2\times10^{18}$ boron atoms per cm.$^3$. The conductivity and the charge carrier concentration of anode region 15 and gate region 17 increase with increasing distance from the base region 21'. The conductivity of regions 15 and 17 declines to about the same value at junctions 16 and 18 respectively, but the initial conductivity of region 15 is more than two orders of magnitude (i.e., a hundred times) greater than the initial conductivity of region 17, and region 15 is only about 1½ times as thick as region 17. The conductivity gradient of the anode region 15 is thus at least an order of magnitude steeper than the conductivity gradient of the gate region 17.

One advantage of the device thus fabricated with asymmetric gate and anode regions is improved switching time. Conventional symmetrical devices according to the prior art switch on the average in about 30 microseconds for a given size. In contrast, a comparable asymmetrical device made by this method with anode conductivity gradient steeper than gate conductivity gradient switches on the average in about 20 microseconds. Switching time is extremely circuit dependent, and the above figures refer to devices tested in the identical circuit.

An advantage of devices fabricated according to this example with an anode conductivity gradient steeper than the gate conductivity gradient is that they can withstand current surges better than comparable devices of the same size made according to the prior art. The single pulse surge capacity of some prior art devices is about 250 amperes. In contrast, the single pulse surge capability of comparable devices according to the invention is about 400 amperes.

Another advantage of devices according to this example is that the current gain of the device is more constant as the anode-cathode current increases than the prior art, symmetrical devices.

EXAMPLE II

A slice or wafer 30 (FIGURE 2*d*) of given conductivity type crystalline semiconductive material is prepared with two opposing major faces 31 and 32. Wafer face 30 may, for example, consist of N-type monocrystalline silicon. Wafer 30 is heated in a furnace tube (not shown) at about 1280° C. for about 20 hours in a non-oxidizing ambient containing boron oxide vapors. The boron oxide vapors are introduced into the furnace tube from a container of boron oxide heated to about 870° C. Under these conditions, a boron-containing diffused zone about 1.5 mils deep is formed immediately adjacent the wafer surface. The concentration of boron at the surface of wafer 30 is about $2\times10^{18}$ boron atoms per cm.$^3$. Since this surface zone is converted to P-type conductivity by the boron diffused therein, a rectifying barrier or p-n junction is formed between the P-type surface zone and the N-type bulk of wafer 30.

Figures 2A, 2B, 2C, 2D, 2E, 2F:
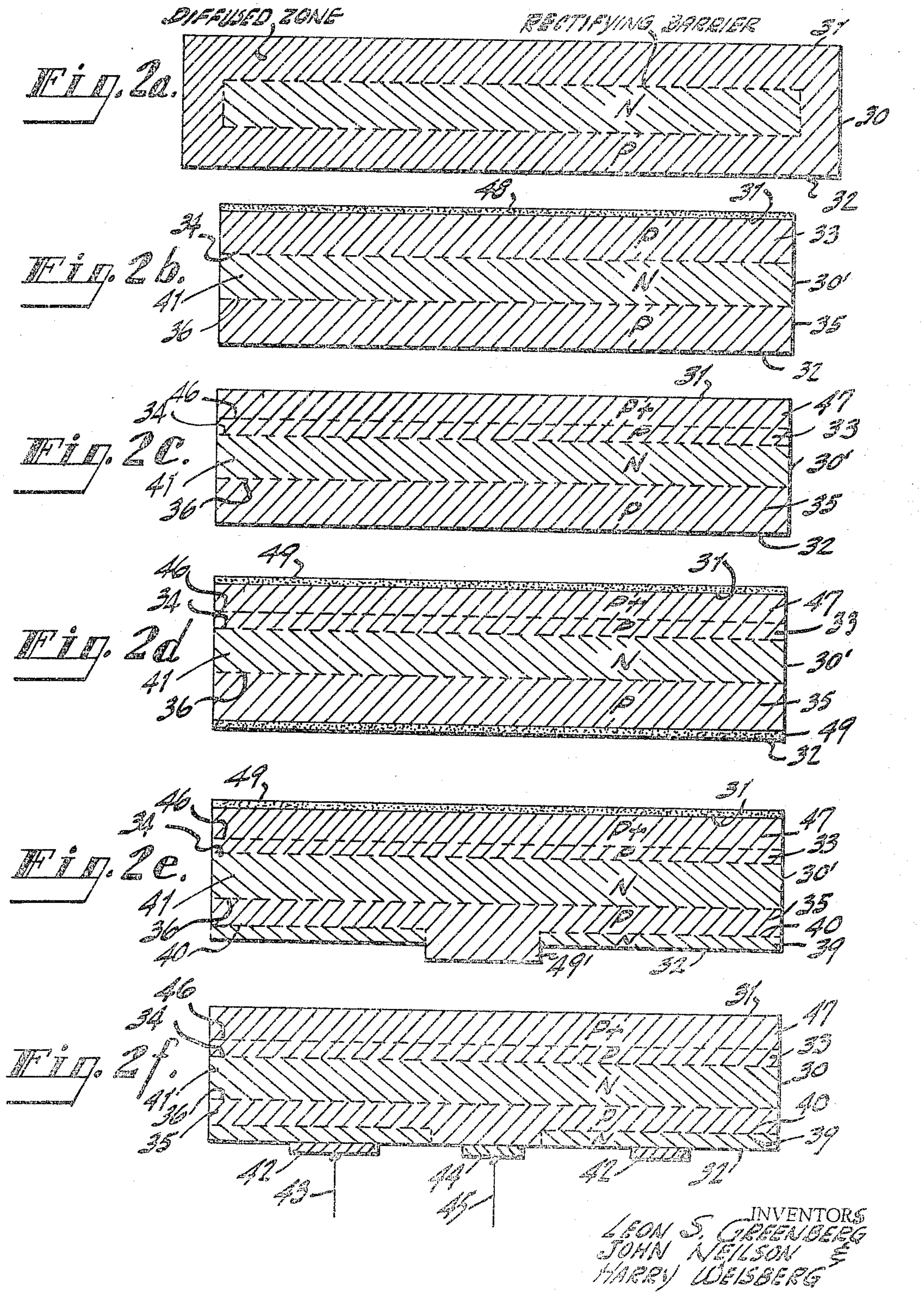
FIGURES 2*a*–2*f* are cross-sectional views of a semiconductive wafer during successive steps in the fabrication of a semiconductor device according to another embodiment of the invention; and, FIGURES 3*a*–3*f* are cross-sectional views of a semiconductive wafer during successive steps in the fabrication of a semiconductor device according to another embodiment.

Referring now to FIGURE 2*b*, the ends or peripheral portions of the wafer are removed by any convenient method, leaving wafer 30' with two boron-diffused P-type zones or regions 33 and 35 immediately adjacent wafer faces 31 and 32, respectively, a central N-type portion 41 between zones 33 and 35, a p-n junction 34 between region 33 and the N-type central zone, and a p-n junction 36 between region 35 and the central zone. One wafer face 31 is painted with a solution consisting of a boron compound, such as boron oxide and the like, in a volatile solvent such as Cellosolve, or the like. The solvent evaporates, leaving a thin deposit 48 of the boron compound on the wafer face 31.

Wafer 30' is then heated at about 1280° C. for about 7 hours. During this step, sufficient boron diffuses into wafer face 31 to a depth 46 so as to convert a portion 47 (FIGURE 2*c*) of P-type zone 33 immediately adjacent wafer face 31 to P+ conductivity. Under these conditions, the thickness of the P+ zone 47 is about one mil, and the concentration of boron at wafer face 31 is about $10^{21}$ boron atoms per $cm.^3$. Since this step is performed for a relatively short time, the p-n junctions 34 and 36 are only slightly affected, and may move only about 0.1 mil deeper into the wafer. After this diffusion, the boron deposit 48 on wafer face 31 may be removed by light etching.

Wafer 30' is now heated in an oxidizing ambient, such as air, or oxygen, or steam, so as to form a silicon oxide layer 49 (FIGURE 2*d*) on wafer faces 31 and 32.

Referring now to FIGURE 2*e*, a portion of the silicon oxide layer 49 on wafer face 32 is now removed by any convenient method, such as grinding, or lapping, or masking and etching. The remainder 49' of the silicon oxide layer on wafer face 32 serves as a diffusion mask. Wafer 30' is heated in ambient containing phosphorus pentoxide vapors for about 1½ hours at about 1225° C. A thin phosphorus-diffused N-type region 39 is thus introduced in wafer 30' adjacent the exposed unmasked portions of wafer face 32. A p-n junction 40 is formed at the interface between the phosphorus-diffused wafer region 39 and the boron-diffused wafer region 35.

The silicon oxide coating 49 and 49' is removed, for example by etching, and a ring-shaped metallic electrode 42 (FIGURE 2*f*) is deposited by any convenient method, for example by evaporation, on wafer face 32 so as to form an ohmic contact to the N-type region 39. At the same time, an ohmic contact 44 is made to the P-type region 35. Contact 44 is suitably formed within the area bounded by the ring-shaped electrode 42. The device is completed by attaching elecrical leads 43 and 45 to electrodes 42 and 44 respectively. An electrical lead may be attached to wafer face 31 at the same time, Alternatively, an electrical connection to region 47 may be made by bonding wafer face 31 to a metallic can, and attaching the lead to the can. The subsequent steps of encapsulating and casing the device are accomplished by standard techniques of the semiconductor art.

In this embodiment, the gate region may be region 35 and the anode region may be region 47. These two regions of the device are asymmetric. The anode region 47 has a *P+P* structure, and has a high charge carrier concentration and high conductivity at wafer face 31, since the boron concentration at wafer face 31 is about $10^{21}$ boron atoms per $cm.^3$. The gate region 35 is P-type, and has a boron concentration at the surface of about $2\times10^{18}$ boron atoms per $cm.^3$. The conductivity of the anode and gate regions 47 and 35 increases with increasing distance from the base region 41, but the conductivity gradient of the anode region is steeper than the conductivity gradient of the gate region. The region 39 is the cathode region. An advantage of this embodiment is that it does not require the step of lapping the wafer.

EXAMPLE III

In this embodiment, a slice or wafer 60 (FIGURE 3*a*) of given conductivity type crystalline semiconductive material is prepared with two opposing major faces 61 and 62. As in the previous embodiment, an opposite conductivity type modifier is diffused into the surface of wafer 60 to form an opposite conductivity type diffused surface zone, and a rectifying barrier or p-n junction between the given conductivity type bulk of the wafer and the opposite conductivity type diffused surface zone. The exact size, shape, material and conductivity type of wafer 60 are not critical in the practice of the invention. In this embodiment, wafer 60 consists of N conductivity type monocrystalline silicon. The opposite type diffused zone is therefore of P conductivity type, and is conveniently formed by heating wafer 60 in an ambient containing a vaporized acceptor. The depth of the P-type diffused region will depend on the time and temperature of the heating step, as well as on the concentration of the acceptor in the ambient. For example, wafer 60 may be heated at about 1280° C. for about 20 hours in a non-oxidizing ambient containing boron oxide vapors in sufficient concentration to form a boron-diffused surface zone about 1.5 mils deep.

Figures 3A, 3B, 3C, 3D, 3E, 3F:
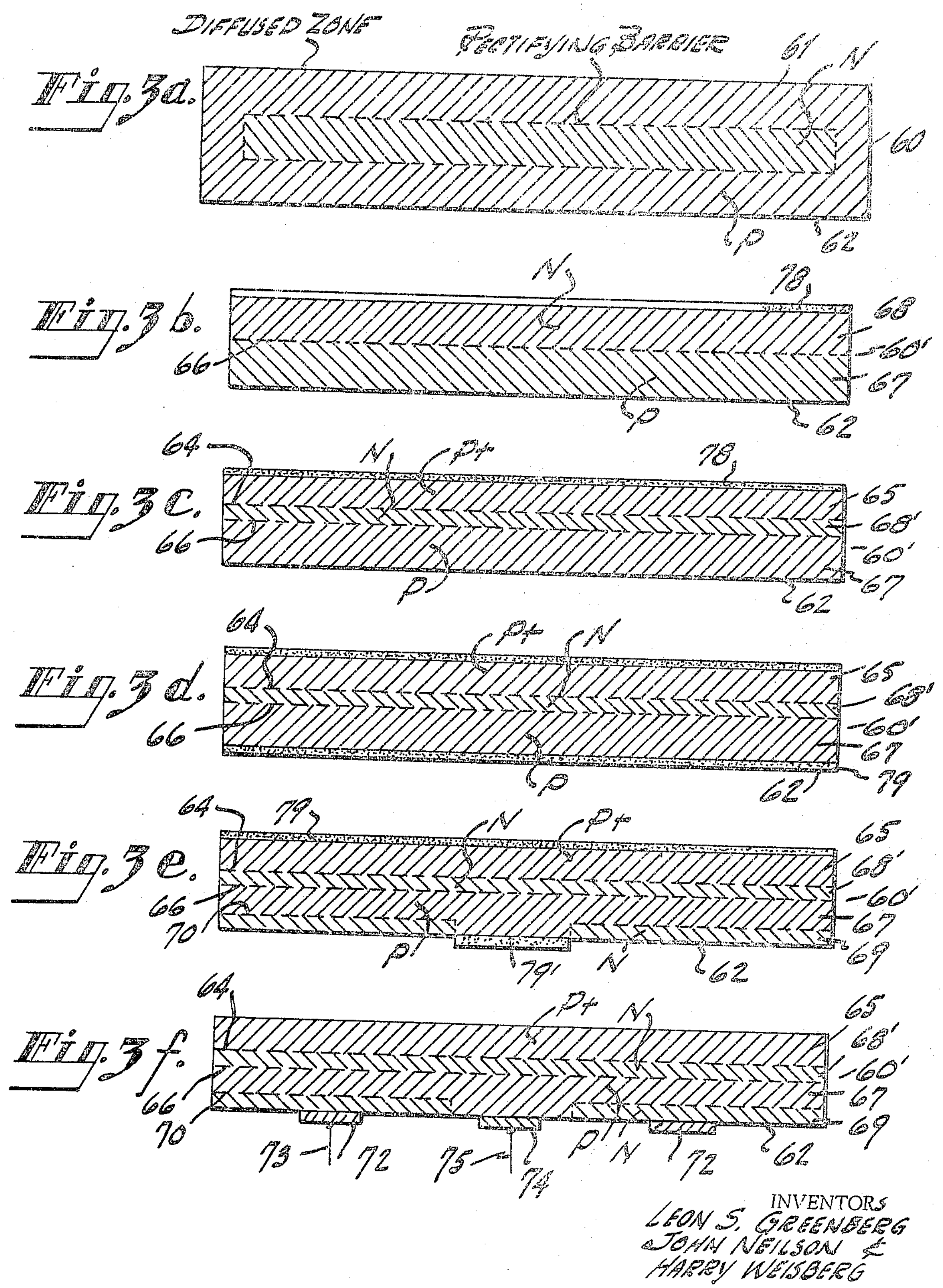

The end or peripheral portions of wafer 60, and the boron-diffused zone adjacent major face 61 are removed by any convenient technique, such as grinding or lapping, or masking and etching, leaving wafer 60' as in FIGURE 3*b*, with a boron-diffused P-type zone 67 adjacent wafer face 62, an N-type zone 68, and a p-n junction 66 between two zones. The major face of wafer 60' immediately adjacent the N-type zone 68 is painted with a solution consisting of a boron compound, such as boric acid and the like, in a volatile solvent, such as Cellosolve and the like. The solvent evaporates, leaving a thin deposit 78 of the boron compound on the wafer face.

Wafer 60' is then heated in a non-oxidizing ambient at about 1280° C. for about 7 hours. During this step, boron diffuses into the N-type wafer zone 68 to a depth of about one mil so as to convert a surface zone or portion 65 (FIGURE 3*c*) of N-type zone 68 to P+ conductivity. Zone 65 is thus about one mil thick, and has a boron concentration at the wafer surface of about $10^{21}$ boron atoms per $cm.^3$. A rectifying barrier 64 is formed at the interface between the P+ zone 65 and the remainder 68' of the N-type zone. The previously formed p-n junction 66 is only slightly affected under these conditions.

Referring now to FIGURE 3*d*, the boron deposit 78 is removed by light lapping or etching, and wafer 60 is heated in an oxidizing ambient such as air or steam, so as to form a silicon oxide layer 79 over the surface of the wafer.

A predetermined (selected) portion of the silicon oxide layer 79 on wafer face 62 is removed by any convenient method, such as lapping, or masking and etching. The remainder 79' (FIGURE 3*e*) of the silicon oxide layer on wafer face 62 serves as a diffusion mask. Wafer 60' is heated in an ambient containing phosphorus pentoxide vapors for about 1½ hours at about 1225° C. A thin phosphorus-diffused N-type region 69 is thus introduced in wafer 60' adjacent the exposed unmasked portions of wafer face 62. A p-n junction 70 is formed at the interface between the phosphorus-diffused wafer region 67.

Referring now to FIGURE 3*f*, the silicon oxide coating 79 and 79' is removed, for example by etching, and a ring-shaped metallic electrode 72 is deposited by any convenient method, for example by evaporation, on wafer face 62 so as to form an ohmic contact to the N-type region 69. At the same time, an ohmic contact 74 is made to the P-type region 67. Contact 74 is suitably formed within the area bounded by the ring-shaped electrode 72. The device is completed by attaching electrical leads 73 and 75 to electrodes 72 and 74 respectively. An electrical lead may be attached to the opposite face of wafer 60' at the same time. Alternatively, an electrical connection to the P+ region 65 may be made by means of the hermetically sealed metallic can in which the device is subsequently enclosed. The steps of encapsulating and casing the device are accomplished by standard techniques of the semiconductor art, and need not be described here.

In this embodiment, as in the previous ones, the anode region 65 and the gate region 67 are asymmetric. The anode region has a high charge carrier concentration and high conductivity at the wafer surface, where the boron concentration is about $10^{21}$ boron atoms per $cm.^3$. The boron concentration at the surface of the gate region is about $2\times10^{18}$ atoms per $cm.^3$. The conductivity of the anode region and gate region increases with increasing distance from the base region 68', but the conductivity gradient of the anode region is steeper than the conductivity gradient of the gate region. The conductivity gradient of the anode region in this example is steeper than the conductivity gradient of the anode region in the device of Example II, and hence the device of this example has a faster turn-off than the device of Example II.

Another unexpected feature of devices according to the invention is that their turn-on time is less than the turn-on time of comparable prior art devices.

The above embodiments of the invention have been described by way of example only, and not limitation. If desired, the conductivity type of the various wafer regions described may be reversed, utilizing appropriate acceptors and donors. Other crystalline semiconductors may be utilized instead of silicon. The asymmetry of the gate and anode regions of the device may be attained by any convenient procedure, as long as the conductivity gradient of the anode region is made steeper than the conductivity gradient of the gate region, and the conductivity of the anode and gate regions increases with increasing distance from the gate region. Other variations and modifications may be made by those skilled in the art without departing from the spirit and scope of the instant invention as described in this specification and in the appended claims.

What is claimed is:

1. In a semiconductor junction device comprising a crystalline semiconductive wafer having two opposing major faces,
- a first wafer region of given conductivity type adjacent a first portion of one said major face,
- a second wafer region of opposite conductivity type adjacent a second portion of said one face and adjacent said first region,
- a third wafer region of said given conductivity type adjacent said second region,
- a fourth wafer region of said opposite conductivity type between said third region and the other said major wafer face, the charge carrier concentration across the entire thickness of said fourth region and across the entire thickness of said second region increasing with increasing distance from said third region,
- first and second electrical leads on said one face to said first and second regions respectively,
- and a third lead on said other major face to said fourth region,
- the improvement comprising the charge carrier concentration on the surface of said fourth region being more than 100 times greater that the charge carrier concentration on the surface of said second region, and,
- the conductivity gradient of said fourth region being steeper than the conductivity gradient of said second region.

2. In a semiconductor junction device comprising a crystalline semiconductive wafer having two opposing major faces,
- a first wafer region of given conductivity type adjacent a first portion of one said major face,
- a second wafer region of opposite conductivity type adjacent a second portion of said one face and adjacent said first region,
- a third wafer region of said given conductivity type adjacent said second region,
- a fourth wafer region of said opposite conductivity type between said third region and the other said major wafer face, the charge carrier concentration across the entire thickness of said fourth region and across the entire thickness of said second region increasing with increasing distance from said third region,
- first and second electrical leads on said one face to said first and second regions respectively,
- and a third electrical lead on said other major face to said fourth region,

- the improvement comprising the charge carrier concentration on the surface of said fourth region being more than 100 times greater than the charge carrier concentration on the surface of said second region, and,
- the conductivity gradient of said fourth region being at least an order of magnitude steeper than the conductivity gradient of said second region,
- said fourth region being thicker than said second region.

3. In a controlled rectifier comprising a crystalline semiconductive wafer having two opposing major faces,
- a cathode region of given conductivity type adjacent a first portion of one said major face,
- a gate region of opposite conductivity type adjacent a second portion of said one major face and adjacent said cathode region,
- a base region of said given conductivity type adjacent said gate region,
- an anode region of said opposite conductivity type between said base region and the other said major wafer face, the charge carrier concentration across the entire thickness of said anode region and across the entire thickness of said gate region increasing with increasing distance from said base region,
- cathode and gate leads on said one major face to said cathode region and said gate region respectively,
- and an anode lead on the other said major face to said anode region,
- the improvement comprising the charge carrier concentration on the surface of said anode region being more than 100 times greater than the charge carrier concentration on the surface of said gate region.

4. In a controlled rectifier comprising a crystalline semiconductive wafer having two opposing major faces,
- a cathode region of given conductivity type adjacent a first portion of one said major face,
- a gate region of opposite conductivity type adjacent a second portion of said one major face and adjacent said cathode region,
- a base region of said given conductivity type adjacent said gate region,
- an anode region of said opposite conductivity type between said base region and the other said major wafer face, the charge carrier concentration across the entire thickness of said anode region and across the entire thickness of said gate region increasing with increasing distance from said base region,
- cathode and gate leads on said one major face to said cathode region and said gate region respectively,
- and an anode lead on the other said major face to said anode region,
- the improvement comprising the charge carrier concentration on the surface of said anode region being more than 100 times greater than the charge carrier concentration on the surface of said gate region,
- and the conductivity gradient of said entire anode region being at least an order of magnitude steeper than the conductivity gradient of said gate region.

References Cited

UNITED STATES PATENTS

| | | | |
|---|---|---|---|
| 3,006,791 | 10/1961 | Webster | 317—235 X |
| 3,218,525 | 11/1965 | Moore et al. | 317—235 |
| 3,242,551 | 3/1966 | Moyson et al. | 29—25.3 |
| 3,249,831 | 5/1966 | New et al. | 317—235 |

JOHN W. HUCKERT, *Primary Examiner.*

A. M. LESNIAK, *Assistant Examiner.*